US012379858B2

(12) United States Patent
Vogelsang et al.

(10) Patent No.: US 12,379,858 B2
(45) Date of Patent: *Aug. 5, 2025

(54) MEMORY MODULE WITH PERSISTENT CALIBRATION

(71) Applicant: Rambus Inc., San Jose, CA (US)

(72) Inventors: Thomas Vogelsang, Jericho, VT (US); Brent Steven Haukness, Sunnyvale, CA (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/643,662

(22) Filed: Apr. 23, 2024

(65) Prior Publication Data

US 2024/0345745 A1   Oct. 17, 2024

Related U.S. Application Data

(63) Continuation of application No. 17/721,176, filed on Apr. 14, 2022, now Pat. No. 11,989,430.

(60) Provisional application No. 63/201,169, filed on Apr. 15, 2021.

(51) Int. Cl.
*G06F 3/06* (2006.01)

(52) U.S. Cl.
CPC .......... *G06F 3/0629* (2013.01); *G06F 3/0604* (2013.01); *G06F 3/0679* (2013.01)

(58) Field of Classification Search
CPC ..... G06F 3/0604; G06F 3/0629; G06F 3/0679
See application file for complete search history.

(56) References Cited

U.S. PATENT DOCUMENTS

| | | |
|---|---|---|
| 6,321,282 B1 | 11/2001 | Horowitz et al. |
| 7,412,627 B2 | 8/2008 | Bains et al. |
| 10,430,092 B1 | 10/2019 | Wu et al. |
| 2019/0295606 A1 | 9/2019 | Parry et al. |

OTHER PUBLICATIONS

Jedec Standard, "FBDIMM: Advanced Memory Buffer (AMB)", JESD82-20, Jedec Solid State Technology Association, Mar. 2007, 190 pages.

*Primary Examiner* — Yong J Choe
(74) *Attorney, Agent, or Firm* — Lowenstein Sandler LLP (57) ABSTRACT

A memory module includes one or more memory devices and a memory interface chip coupled to the one or more memory devices via one or more communication links. The memory module further includes a persistent memory storing one or more sets of training and calibration settings corresponding to communication over the one or more communication links, where the one or more sets of training and calibration settings are stored in the persistent memory before operation of the memory module and used to configure one or more components of the memory interface chip during the operation of the memory module.

20 Claims, 6 Drawing Sheets

MEMORY MODULE WITH PERSISTENT CALIBRATION

RELATED APPLICATIONS

This application is a continuation of U.S. patent application Ser. No. 17/721,176, filed Apr. 14, 2022, which claims the benefit of U.S. Provisional Patent Application No. 63/201,169, filed Apr. 15, 2021, each of which is incorporated herein by reference.

BACKGROUND

Modern computer systems generally include a data storage device, such as a memory component. The memory component may be, for example a random access memory (RAM) or a dynamic random access memory (DRAM). The memory component includes memory banks made up of storage cells which are accessed by a memory controller through a command interface and a data interface within the memory component.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Aspects of the present disclosure include a memory module with persistent calibration. In one embodiment, a memory module, such as a dual in-line memory module (DIMM), including a number of memory devices, such as dynamic random access memory (DRAM) devices or a solid state drive (SSD) including a number of memory devices, such as flash memory devices, can further include a memory interface chip, such as a memory buffer or flash memory controller, to control certain communications between the memory module and an external device, such as a memory controller or host system. Depending on the implementation, the memory interface chip can be connected internally within the memory module to the individual memory devices via associated links, such as command/address lines and/or data lines. Those links, however, are not connected externally to the memory module, as the memory interface chip includes a separate external connection. Thus, any process variations associated with the memory devices, the memory interface chip, and the associated links connecting them to one another, and which could potentially impact the transmitting and receiving of signals across those internal links, are fixed after manufacturing and assembly of the memory module is complete.

Accordingly, in one embodiment, training and calibration of the internal links can be performed before the memory module is put into operation, such as at a time when manufacturing and/or assembly of memory module is completed, since the effects of the process variations will not change thereafter. For example, the training and calibration can result in the generation of corresponding settings to be used during operation of the memory device to account for any process variations present. In one embodiment, the memory module includes persistent memory (e.g., located within the memory interface chip or elsewhere on the module) where command/address training and calibration settings, as well as data training and calibration settings, for the internal links can be stored. Control logic in the memory interface chip, or elsewhere in the memory module, can access the stored training and calibration settings (e.g., at power-up of the memory module) and configure the internal communication links according to those settings during operation of the memory module. In one embodiment, multiple sets of training and calibration settings can be stored, such as settings corresponding to different combinations of temperature, voltage, operating frequency, etc. In addition, the persistent memory can store pre-populated configuration settings for the memory devices themselves.

Certain memory modules include a power supply circuit, such as a power management integrated circuit (PMIC) that locally regulates the voltage supply used by the components of the memory module. As such, the memory module need not rely on power supply management from an external source, which results in more stable voltages being used. Thus, the impact of variations in the voltage supply on such memory modules is largely negligible, and separate training and calibration settings associated with the voltage variations are not needed. Furthermore, certain memory modules implement liquid cooling systems or cooling techniques that lead to relatively small temperature distributions for the memory modules. Thus, the impact of variations in the operating temperature on such memory modules is not significant, and separate training and calibration settings associated with the temperature variations are also not required.

Benefits that can be realized with certain embodiments of the approach described herein include, but are not limited to, the ability to perform training and calibration operations, and determine associated training and calibration settings, for the internal communication links of a memory module before the memory module is put into operation. Since the memory interface chip of the memory module isolates the internal links from external connections, the effects of process variations in the memory module will not change after manufacturing and assembly of the memory module is complete. Thus, the training and calibration can be performed at that time, with the associated training and calibration settings being stored in persistent memory of the memory module (e.g., within the memory interface chip). In this manner, the need to periodically perform training and calibration during operation of the memory module is reduced or even eliminated, thereby decreasing the workload and freeing resources for other operations, which improves performance of the memory module. Additional details with respect to the memory module with persistent calibration are provided below with respect to FIGS. 1-5.

Figure 1:
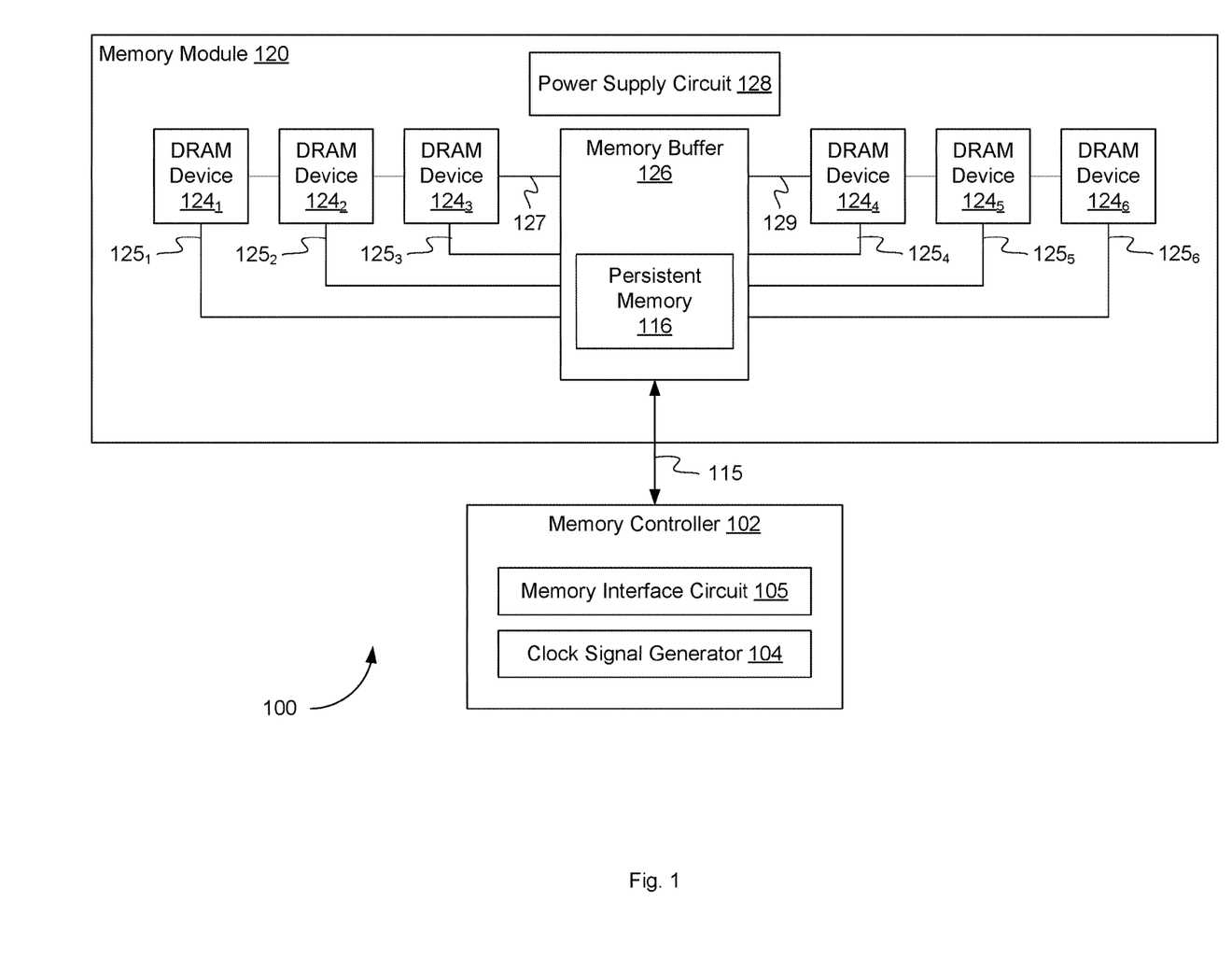
FIG. 1 is a block diagram illustrating a computing environment with a memory module having persistent calibration, according to an embodiment.

FIG. 1 depicts an environment 100 showing a memory module 120. As an option, one or more instances of environment 100 or any aspect thereof may be implemented in the context of the architecture and functionality of the embodiments described herein.

As shown in FIG. 1, environment 100 comprises a memory controller 102 coupled to a memory module 120. In one embodiment, memory module 120 is a dual in-line memory module (DIMM). Such memory modules can be referred to as DRAM DIMMs or load reduced DIMMs (LRDIMMs), and can share a memory channel with other DIMMs.

In one embodiment, the memory controller 102 comprises a clock signal generator 104 and a memory interface circuit 105. Depending on the embodiment, memory controller 102 can comprise multiple instances each of clock signal generator 104 and memory interface circuit 105. The memory controller 102 can further include a cache memory (not shown), which can be dedicated to a single processing core or shared with other cores. Clock signal generator 104 may include a phase lock loop (PLL) or other circuit to generate one or more clock signals. In other embodiments, clock signal generator 104 may receive one or more clock signals from a source external to the memory controller 102. In either embodiment, memory interface circuit 105 may include a driver to drive the one or more clock signals from clock signal generator 104 out of memory controller 102 (e.g., to components such as buffer chips on memory module 120).

In one embodiment, the memory interface circuit 105 of the memory controller 102 communicates with the memory module 120 via a communications bus 115. Specifically, the memory interface circuit 105 can write data to and/or read data from multiple sets of DRAM devices $124_1$-$124_6$ by sending the data over the communications bus 115. In one embodiment, communications bus 115 is a Compute Express Link (CXL) bus implementing the CXL specification, connected, for example, to a PCIe port of memory controller 102. In other embodiments, communication bus 115 can implement another specification, such as Open Memory Interface, Gen-Z, or some other specification. For example, the communication bus 115 can be used to convey signals transmitted by the memory interface circuit 105, such as data signals, a chip select signal, and/or a data strobe signal. In one embodiment, communication bus 115 can include two or more groups of multiple data signals (e.g., four data signals per group), with each group having a corresponding strobe signal or signals, generated by clock signal generator 104. Memory interface circuit 105 can transmit the data signals together with the strobe signals to memory module 120 over and communication bus 115.

The DRAM devices $124_1$-$124_6$ in memory module 120 can each comprise an array of memory devices (e.g., SDRAM) arranged in various topologies (e.g., A/B sides, single-rank, dual-rank, quad-rank, etc.). Although a certain number of DRAM devices $124_1$-$124_6$ are illustrated in FIG. 1, this is merely an exemplary embodiment, and it should be understood that in other embodiments, memory module 120 can include any other number of DRAM devices. In one embodiment, as shown, the data signals sent to and/or from the DRAM devices $124_1$-$124_6$ can be buffered by a memory interface chip, such as memory buffer 126. Such a memory buffer 126 can serve to redrive the signals (e.g., data or DQ signals, etc.) on communications bus 115 to help mitigate high electrical loads of large computing and/or memory systems. For example, the memory buffer 126 can include a signal transmitter circuit to transmit the signals and a signal receiver to receive the signals. In one embodiment, at least a portion of the DRAM devices (e.g., DRAM devices $124_1$-$124_3$) are connected to memory buffer 126 by a shared command/address line 127, while another portion of the DRAM devices (e.g., DRAM devices $124_4$-$124_6$) are connected to memory buffer 126 by a shared command/address line 129. In another embodiment, all of DRAM devices $124_1$-$124_6$ are connected to memory buffer 126 by a single shared command/address line. In one embodiment, each of DRAM devices DRAM devices $124_1$-$124_6$ are connected to memory buffer 126 by respective data lines $125_1$-$125_6$.

In addition, command/address signals from the memory interface circuit 105 can be received by memory buffer 126 at the memory module 120 using communication bus 115. A memory buffer, such as command buffer 126, can comprise a logical register and a phase-lock loop (PLL) to receive and re-drive command and address input signals from the memory controller 102 to the DRAM devices on a DIMM (e.g., DRAM devices $124_1$, DRAM devices $124_2$, etc.), reducing clock, control, command, and address signal loading by isolating the DRAM devices from the memory controller 102.

In one embodiment, memory module 120 includes persistent memory 116. In one embodiment, persistent memory 116 is implemented within memory buffer 126. In another embodiments, persistent memory 116 may be located elsewhere, such as within one or more of DRAM devices $124_1$-$124_6$ or at some other location within memory module 120. Depending on the embodiment, the persistent memory 116 can include non-volatile random-access memory (NVRAM), flash memory (e.g., NOR- or NAND-based flash memory), ferroelectric RAM (FeRAM), magnetoresistive RAM (MRAM), phase-change RAM (PRAM), or some other persistent memory type. As described in more detail below, persistent memory 116 can be used to store training and calibration settings for the links between memory buffer 126 and DRAM devices $124_1$-$124_6$. For example, persistent memory 116 can store command/address training and calibration settings for shared command/address lines 127 and 129, as well as data training and calibration settings for data lines $125_1$-$125_6$. In one embodiment, since command/address lines 127 and 129 and data lines $125_1$-$125_6$ are internal communication links contained entirely within memory module 120 (i.e., they are isolated from memory controller 102 and any other external components), these training and calibration settings are predetermined (e.g., at a time when manufacturing and/or assembly of memory module 120 is performed) and stored in persistent memory 116 to be accessed by control logic of memory buffer 126 (e.g., at power-up of the memory module 120) and used during operation of memory module 120. In addition, persistent memory 116 can store pre-populated configuration settings for DRAM devices $124_1$-$124_6$ (e.g., training and calibration settings for signal drivers or other components of the DRAM devices).

In one embodiment, memory module 120 further includes power supply circuit 128. In one embodiment, power supply circuit 128 may include a battery, power adaptor, or power management integrated circuit (PMIC) that is used to supply a source voltage to various load circuits (e.g., DRAM devices $124_1$-$124_6$ or memory buffer 126) that is used for some intended operation. A PMIC, for example, is a solid state device that controls the flow and direction of electrical power. A PMIC can incorporate more than one function, such as different power conversions and power controls, including voltage supervision and undervoltage protection. By incorporating these functions into one integrated circuit, the PMIC can provide strong conversion efficiency, at a relatively small size, with improved heat dissipation. The use of a PMIC in memory module 120 provides a locally regulated voltage supply leading to more stable voltages when operating DRAM devices $124_1$-$124_6$ and memory buffer 126.

The memory module 120 shown in environment 100 presents merely one partitioning. In other embodiments, in addition or in the alternative, memory module 120 may include other volatile memory devices, such as synchronous DRAM (SDRAM), Rambus DRAM (RDRAM), static random access memory (SRAM), etc. The specific example shown where the memory buffer 126 and the DRAM devices $124_1$-$124_2$ are separate components is purely exemplary, and other partitioning is possible. For example, any or all of the components comprising the memory module 120 and/or other components can comprise one device (e.g., system-on-chip or SoC), multiple devices in a single package or printed circuit board, multiple separate devices, and can have other variations, modifications, and alternatives. In addition, memory controller 102 may include additional and/or different components than those illustrated in FIG. 1. Furthermore, the illustrated components may be arranged differently depending on the embodiment.

Figure 2:
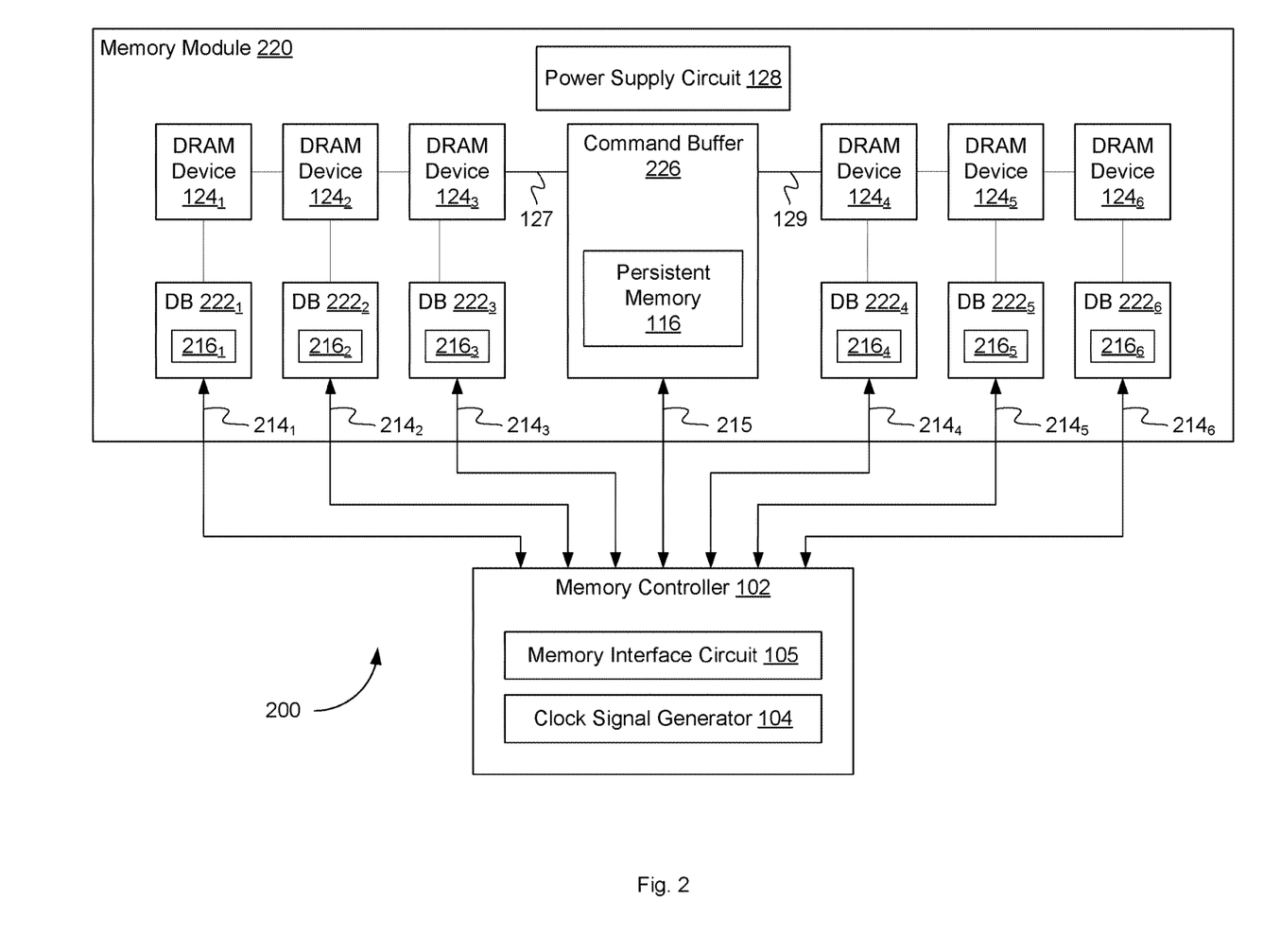
FIG. 2 is a block diagram illustrating a computing environment with a memory module having persistent calibration, according to an embodiment.

FIG. 2 depicts an environment 200 showing a memory module 220. As an option, one or more instances of environment 200 or any aspect thereof may be implemented in the context of the architecture and functionality of the embodiments described herein.

As shown in FIG. 2, environment 200 comprises a memory controller 102 coupled to a memory module 220 through one or more communications busses. In one embodiment, memory module 220 is a dual in-line memory module (DIMM). Such memory modules can be referred to as load-reduced DIMMs (LRDIMMs), and can share a memory channel with other DIMMs.

In one embodiment, the memory interface circuit 105 of the memory controller 102 communicates with the memory module 220 through a signaling interface formed from one or more communications buses connecting the memory controller 102 with multiple buffer chips on the module. Specifically, the memory interface circuit 105 can write data to and/or read data from multiple sets of DRAM devices $124_1$-$124_6$ using a data busses $214_1$-$214_6$, respectively. For example, the data busses $214_1$-$214_6$ can be used to convey signals transmitted by the memory interface circuit 105, such as a data signal, a chip select signal, and/or a data strobe signal. In one embodiment, data busses $214_1$-$214_6$ can each include two or more groups of multiple data signals (e.g., four data signals per group), with each group having a corresponding strobe signal or signals, generated by clock signal generator 104. Memory interface circuit 105 can transmit the data signals together with the strobe signals to memory module 120 over data busses $214_1$-$214_6$.

In one embodiment, as shown, the data to and/or from the DRAM devices $124_1$-$124_6$ can be buffered by a set of data buffers $222_1$-$222_6$, respectively. Such data buffers (DBs) can serve to redrive the signals (e.g., data or DQ signals, etc.) on data busses $214_1$-$214_6$ to help mitigate high electrical loads of large computing and/or memory systems. For example, each data buffer can include a signal transmitter circuit to transmit the signals.

In addition, command/address signals from the memory interface circuit 105 can be received by a command buffer 226, such as a register clock driver (RCD), at the memory module 220 using a command and address (CA) bus 215. For example, the command buffer 226 might be an RCD such as included in registered DIMMs (e.g., RDIMMs, LRDIMMs, etc.). Command buffers, such as command buffer 226 can comprise a logical register and a phase-lock loop (PLL) to receive and re-drive command and address input signals from the memory controller 102 to the DRAM devices on a DIMM (e.g., DRAM devices $124_1$, DRAM devices $124_2$, etc.), reducing clock, control, command, and address signal loading by isolating the DRAM devices from the memory controller 102.

In one embodiment, memory module 220 includes persistent memories 116 and $216_1$-$216_6$. In one embodiment, persistent memory 116 is implemented within command buffer 226. In another embodiments, persistent memory 116 may be located elsewhere, such as within one or more of DRAM devices $124_1$-$124_6$ or at some other location within memory module 220. As described in more detail below, persistent memory 116 can be used to store training and calibration settings for the links between command buffer 226 and DRAM devices $124_1$-$124_6$. For example, persistent memory 116 can store command/address training and calibration settings for shared command/address lines 127 and 129. In one embodiment, each of persistent memories $216_1$-$216_6$ is implemented within a respective one of data buffers $222_1$-$222_6$. Persistent memories $216_1$-$216_6$ can store, for example, data training and calibration settings for the respective data lines connecting each of data buffers $222_1$-$222_6$ to DRAM devices $124_1$-$124_6$. In one embodiment, these training and calibration settings (i.e., command/address training and calibration settings and data training and calibration settings) are predetermined (e.g., at a time when manufacturing and/or assembly of memory module 220 is performed) and stored in persistent memories 116 and $216_1$-$216_6$ to be accessed by control logic in command buffer 226 or one of data buffers $222_1$-$222_6$ (e.g., at power-up of the memory module 120) and used during operation of memory module 220. In addition, persistent memories 116 and/or $216_1$-$216_6$ can store pre-populated configuration settings for DRAM devices $124_1$-$124_6$ (e.g., calibration settings for signal drivers or other components of the DRAM devices).

Figure 3:
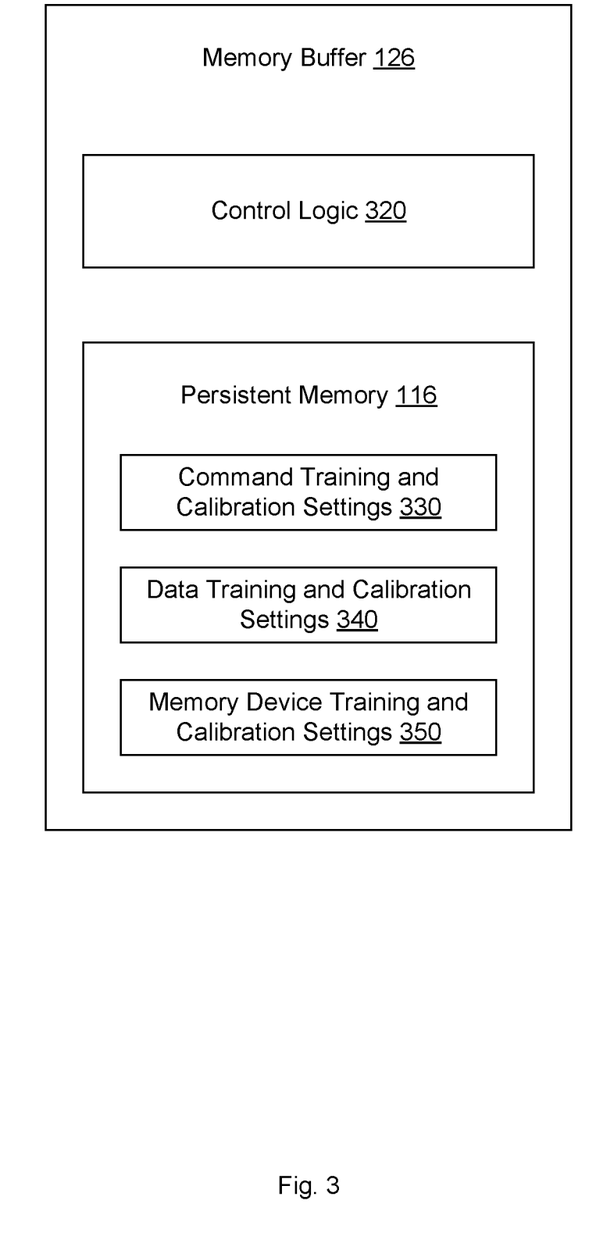
FIG. 3 is a block diagram illustrating a memory buffer with persistent memory for stored training and calibration settings, according to an embodiment.

FIG. 3 is a block diagram illustrating a memory buffer 126 with persistent memory for stored training and calibration settings, according to an embodiment. As illustrated memory buffer 126 includes control logic 320 and persistent memory 116. Depending on the embodiment, control logic 320 can be a processing device, such as one or more general-purpose processing devices including a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Control logic 320 can also be one or more special-purpose processing devices such as an application specific integrated circuit (ASIC), a field programmable gate array (FPGA), a digital signal processor (DSP), network processor, or the like. Control logic 320 is configured to execute instructions for performing the operations and steps discussed herein. As described above, persistent memory 116 is implemented within memory buffer 126 in one embodiment. In other embodiments, however, persistent memory 116 can be located elsewhere within the memory module. The description corresponding to memory buffer 126 can similarly be applicable to data buffers $222_1$-$222_6$ or command buffer 226, and the description of persistent memory 116 can be similarly applicable to persistent memories $216_1$-$216_6$.

In one embodiment, persistent memory 116, whether located within memory buffer 126 or elsewhere, can store various training and calibration settings, such as command training and calibration settings 330, data training and calibration settings 340, and memory device training and calibration settings 350. As described above, the training and calibration settings can be determined as a result of associated training and calibration operations performed previously (e.g., upon completion of manufacture and assembly of the memory module). For example, control logic 320, or some other component, either internal or external to memory device, can perform certain training and calibration operations to determine the training and calibration settings. In one embodiment, one or more of command training and calibration settings 330, data training and calibration settings 340, and memory device training and calibration settings 350 can include multiple sets of training and calibration settings, where each set is associated with a different combination of temperature, voltage, and/or operating frequency.

In one embodiment, control logic 320 can perform the training and calibration operations at different temperatures, voltages, and/or operating frequencies, and store the corresponding settings in persistent memory 116. In general, the training and calibration operations serve to adjust timing or voltage parameters as defined in the specifications of training and calibration of memory devices, such as DRAM devices $124_1$-$124_6$. The various different training and calibration operations which can be performed are described below.

Read training ensures that a read pattern can be correctly received. In one embodiment, a memory device, such as one of DRAM devices $124_1$-$124_6$ can output a data pattern generated by a linear-feedback shift register (LFSR) instead of the results of a normal mode-register-read (MRR). The contents of the LFSR can be repeated on all data lines (DQ), just as for a MRR. In one embodiment, the memory buffer 126 receives the pattern on the data line and compares the pattern to an expected pattern to check for correctness and to adjust how to use the received data signal and data strobe (DQS) to center a data eye.

Read preamble training changes the read strobe behavior such that the strobes are always driven by the memory device, and only toggle during a clock preamble plus the actual burst of the read data. As such, there is no toggle during postamble time. This mode enables the receiver (e.g., memory buffer 126) to detect the timing of when the first data and associated strobe is returned after a read command. If there is more than one memory interface chip, the read preamble training can be coordinated among them.

Command/address (CA) training assures that the memory device can correctly receive a CA signal. In one embodiment, the CA signals are sampled at a rising clock edge when the chip select signal is low, and then logically combined (e.g., XOR-ed) and provided to all DQ. In one embodiment, memory buffer 126 sends the CA signals, receives DQ, and thanks the relative timing of the CA signals, the clock signals, and the chip select signal until the CA signals are correctly received. If there is more than one memory interface chip, the CA training can be coordinated among them.

Chip select (CS) training is performed to establish the timing relationship between the CS signal and the clock signal. In one embodiment, memory buffer 126 sends the CS signal and the clock signal, which are used as inputs to a loop, and the output is provided on the data line (DQ). If there is more than one memory interface chip, the CS training can be coordinated among them.

Write-level training is performed to compensate for skew between DQ channels of different memory devices caused by the fly-by topology of the clock, CS and CA on the module. In one embodiment, memory buffer 126 can adjust the DRAM receivers via their respective Write Leveling Internal Cycle Alignment mode registers, and use the "write leveling" feature and feedback from the DRAM to adjust the DQS to align to the phase and cycle that corresponds to the Write Latency delay after a write command. The memory devices can provide asynchronous feedback on the DQ in write leveling mode. If there is more than one memory interface chip, the write-level training can be coordinated among them.

Driver impedance calibration can be performed by the memory device, in response to a request from a requestor (e.g., memory buffer 126), which can further latch the result. To make this persistent after manufacturing, the memory device can be modified either to include persistent storage for the settings or to include a mechanism where the memory buffer 126 can receive the settings from the memory device, store them in that persistent memory 116, and then write the settings to the memory device later.

Figure 4:
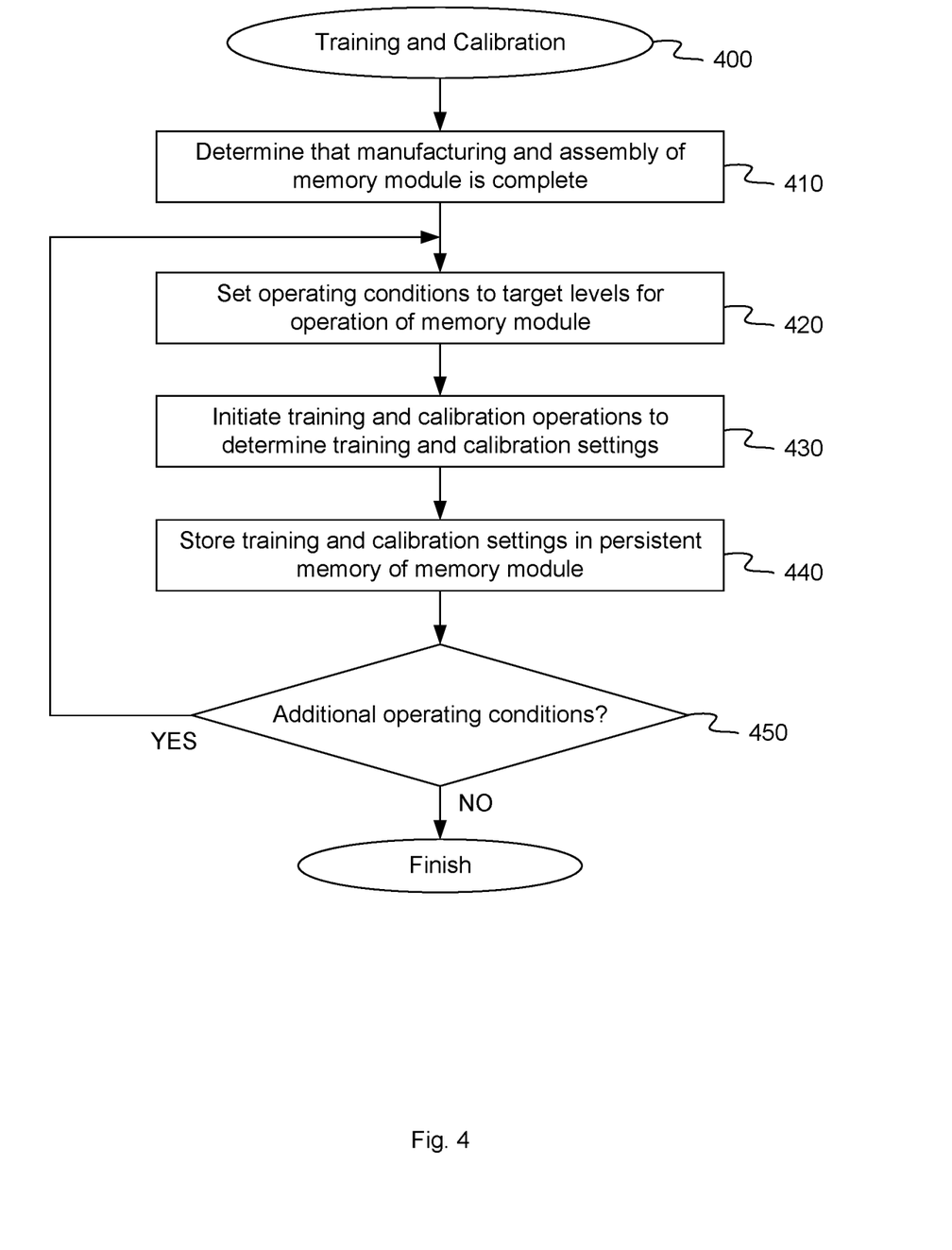
FIG. 4 is a flow diagram illustrating a method of training and calibration during manufacturing and assembly of a memory module, according to an embodiment.

FIG. 4 is a flow diagram illustrating a method of training and calibration during manufacturing and assembly of a memory module, according to an embodiment. The method 400 may be performed by processing logic that may comprise hardware (e.g., circuitry, dedicated logic, programmable logic, microcode, etc.), software (e.g., instructions run on a processing device to perform hardware simulation), or a combination thereof. In one embodiment, the method 400 is performed by control logic 320 of memory buffer 126, as shown in FIG. 3. In another embodiment, the method 400 is performed by a separate training and calibration component, either within or external to memory module 120.

Referring to FIG. 4, at block 410, method 400 determines that manufacturing and assembly of a memory module, such as memory module 120 or memory module 220, is complete. As described above, the memory module can include a number of memory devices, such as DRAM devices $125_1$-$125_6$, and a memory interface chip, such as memory buffer 126, data buffers $222_1$-$222_6$, or command buffer 226. The memory module can further include a number of internal communication links, such as shared command address lines 127 and 129, or individual data lines $125_1$-$125_6$. Upon completion of manufacturing and assembly of these and other components of the memory module, control logic 320 or the separate training and calibration component can receive a notification indicating the completion.

At block 420, method 400 sets one or more operating conditions to target levels for operation of the memory module. The operating conditions can include an operating temperature, voltage supply level, operating frequency, or a combination of two or more of these conditions. In one embodiment, control logic 320 or the separate training and calibration component receives an indication of the operating conditions and the target levels. The target levels can include a particular set of values for one or more of the operating temperature, voltage supply level, and operating frequency at which the memory module is expected to operate. In one embodiment, the target levels can include multiple combinations of different operating conditions and/or different target levels.

At block 430, method 400 initiates one or more training and calibration operations to determine corresponding training and calibration settings. In one embodiment, control logic 320 or the separate training and calibration component initiates the training and calibration operations, which can include for example, one or more of read training, read preamble training, command/address (CA) training, chip select (CS) training, write-level training, driver impedance calibration, or any other training and calibration operation. The training and calibration settings can be performed under the operating conditions set at block 420 to generate corresponding training and calibration settings.

At block 440, method 400 stores the training and calibration settings in the persistent memory of the memory module. As described above and depending on the embodiment, the training and calibration settings can be stored in persistent memory 116 or persistent memories $216_1$-$216_6$. As illustrated in FIGS. 1 and 2, persistent memory 116 can be located within memory buffer 126 or command buffer 226. In other embodiments, however, the persistent memory can be located elsewhere within memory module 120 or memory module 220. The training and calibration settings can include any settings configured to control certain components of the memory interface chip or memory module (e.g., transmitter and receiver circuits of the memory buffer). For example, the training and calibration settings can include individual delays per signal (e.g., analog or a multiple of clock cycles), DLL or PLL lock points, driver strength, trimming of receiver equalization, or other settings.

At block 450, method 400 determines whether there are additional operating conditions for which the memory module is to be trained and calibrated. If so, method 400 returns to block 420 and repeats blocks 420-440 for each remaining set of operating conditions. Once there are no additional operating conditions for which the memory module is to be trained and calibrated, the method 400 is complete.

Figure 5:
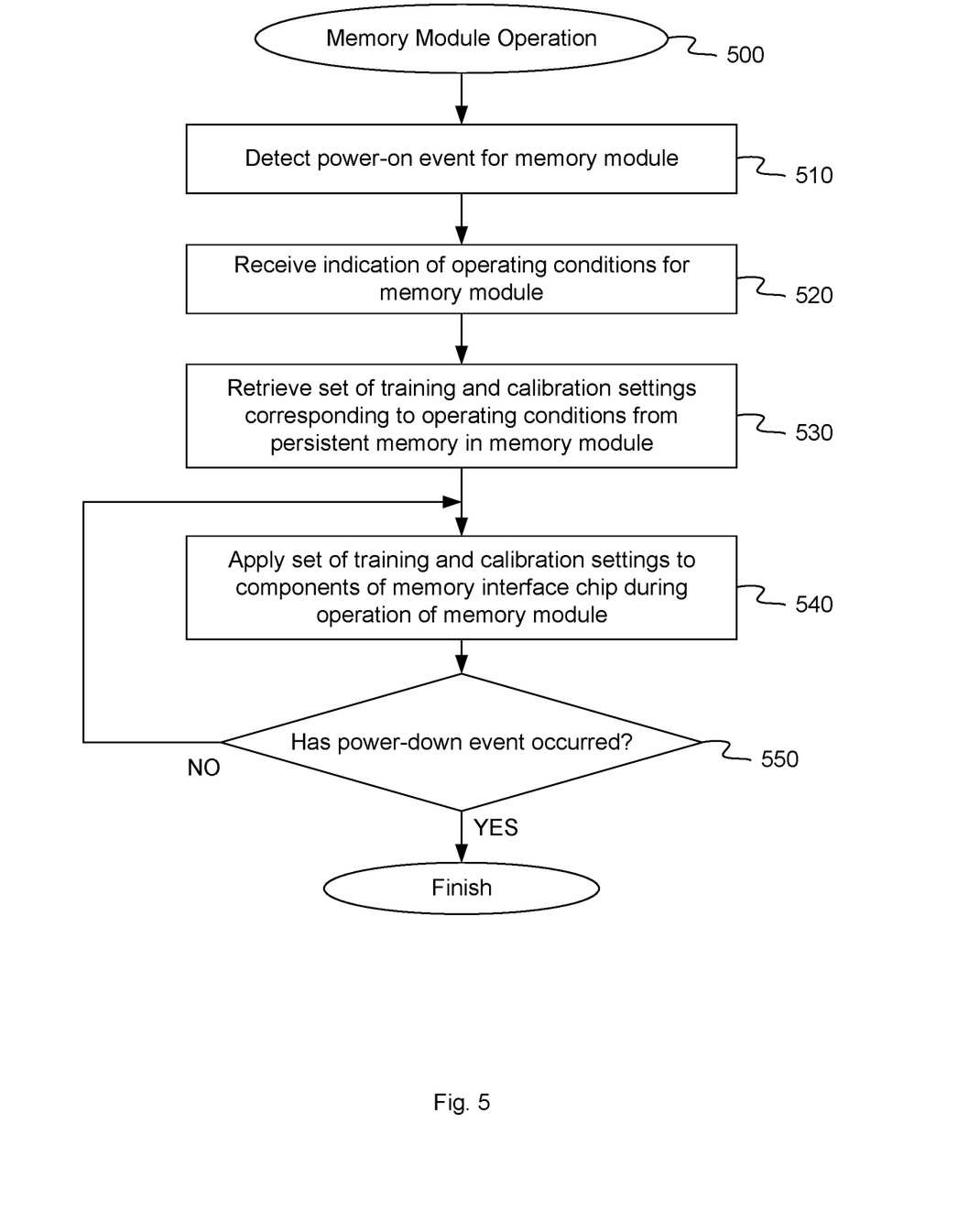
FIG. 5 is a flow diagram illustrating a method of operating a memory module with predetermined training and calibration settings, according to an embodiment.

FIG. 5 is a flow diagram illustrating a method of operating a memory module with predetermined training and calibration settings, according to an embodiment. The method 500 may be performed by processing logic that may comprise hardware (e.g., circuitry, dedicated logic, programmable logic, microcode, etc.), software (e.g., instructions run on a processing device to perform hardware simulation), or a combination thereof. In one embodiment, the method 500 is performed by control logic 320 of memory buffer 126, as shown in FIG. 3.

Referring to FIG. 5, at block 510, method 500 detects a power-on event for a memory module, such as memory module 120 or memory module 220. In one embodiment, the memory module can be in a powered-off state and can be turned on, have power supplied (e.g., from an internal or external power supply), or otherwise activated. Control logic 320 can detect this transition to a powered-on state and initiate an associated startup sequence.

At block 520, method 500 receives an indication of operating conditions for the memory module. The operating conditions can include an operating temperature, voltage supply level, operating frequency, or a combination of two or more of these conditions. In one embodiment, control logic 320 receives an indication of the operating conditions, such as from a host system coupled to the memory module or from some other source. In another embodiment, control logic can include corresponding sensors configured to measure the operating conditions.

At block 530, method 500 retrieves a set of training and calibration settings corresponding to the operating conditions from persistent memory, such as persistent memory 116 or persistent memories $216_1$-$216_6$ in the memory module. In one embodiment, there can be multiple sets of training and calibration settings which were stored in the persistent memory before operation of the memory module (i.e., at a time of manufacturing and assembly as described with respect to FIG. 5). Each of these multiple sets of training and calibration settings can be associated with a different set of operating conditions. Accordingly, control logic 320 can identify the set of training and calibration settings corresponding to the operating conditions identified at block 520 and read those setting from the persistent memory.

At block 540, method 500 applies the set of training and calibration settings to components of the memory interface chip, such as memory buffer 126, command buffer 226, or data buffers $222_1$-$222_6$, during operation of the memory module. For example, control logic 320 can apply the set of training and calibration settings to transmitter and receiver circuits of the memory interface chip. The settings can configure various operating parameters, or otherwise configure certain components of the memory interface chip, to control operation of and communication over the internal communication links, such as the individual delays per signal, DLL or PLL lock points, driver strength, trimming of receiver equalization, or other settings. The settings ensure that the internal communication links, such as shared command address lines 127 and 129, or individual data lines $125_1$-$125_6$ operate as intended.

At block 550, method 500 determines whether a power-down event has occurred. If not, method 500 returns to block 540 where operation of the memory module can continue with the applied set of training and calibration settings. If a power-down event has occurred, method 500 ends.

Figure 6:
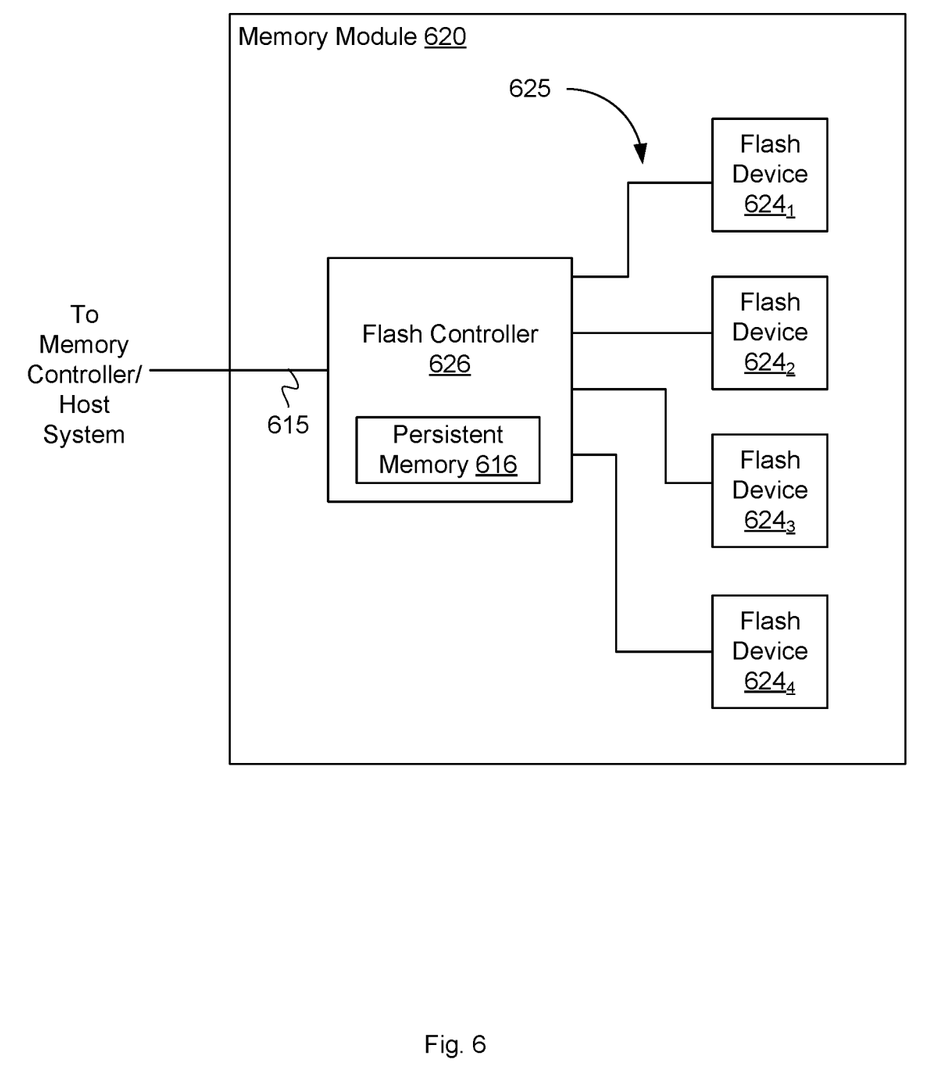
FIG. 6 is a block diagram illustrating a computing environment with a non-volatile memory module having persistent calibration, according to an embodiment.

FIG. 6 depicts a non-volatile memory module 620. In one embodiment, memory module 620 is solid state drive (SSD) including a number of memory devices, such as flash memory devices $624_1$-$624_4$ connected to a memory interface chip, such as flash controller 626. In one embodiment, flash controller 626 communicates with one or more external devices, such as a memory controller and/or host system, via an external communications bus 615. Flash controller 616 can receive data to be written to and/or send data read from flash memory devices $624_1$-$624_4$ over the communications bus 615. In one embodiment, communications bus 615 is a Compute Express Link (CXL) bus implementing the CXL specification. In other embodiments, communication bus 615 can implement another specification, such as PCI Express, Serial ATA (SATA), or some other specification.

The flash memory devices $624_1$-$624_4$ in memory module 620 can each comprise an array of memory devices (e.g., NAND flash, NOR flash) arranged in various topologies. Although a certain number of flash memory devices $624_1$-$624_4$ are illustrated in FIG. 6, this is merely an exemplary embodiment, and it should be understood that in other embodiments, memory module 620 can include any other number of memory devices. In one embodiment, as shown, the data and address signals sent to and/or from the flash memory devices $624_1$-$624_4$ can be buffered by a memory interface chip, such as flash controller 626. For example, the flash controller 626 can include a signal transmitter circuit to transmit the signals and a signal receiver to receive the signals. In one embodiment, flash memory devices $624_1$-$624_4$ are connected to flash controller 626 by respective signal lines 625. Such signal lines 625 are contained entirely within memory module 620 and are isolated from external components by flash controller 626.

In one embodiment, memory module 620 includes persistent memory 616. In one embodiment, persistent memory 616 is implemented within flash controller 626. In another embodiments, persistent memory 616 may be located elsewhere, such as within one or more of memory devices $624_1$-$624_4$ or at some other location within memory module 620. Depending on the embodiment, the persistent memory 616 can include non-volatile random-access memory (NVRAM), flash memory (e.g., NOR- or NAND-based flash memory), ferroelectric RAM (FeRAM), magnetoresistive RAM (MRAM), phase-change RAM (PRAM), or some other persistent memory type. As described in more detail above, persistent memory 616 can be used to store training and calibration settings for the links (i.e., signal lines 625) between flash controller 626 and memory devices $624_1$-$624_4$. In one embodiment, since signal lines 625 are internal communication links contained entirely within memory module 620 (i.e., they are isolated from any other external components), these training and calibration settings are predetermined (e.g., at a time when manufacturing and/or assembly of memory module 620 is performed) and stored in persistent memory 616 to be accessed by control logic of flash controller 626 (e.g., at power-up of the memory module 620) and used during operation of memory module 620. In addition, persistent memory 616 can store pre-populated configuration settings for memory devices $624_1$-$624_4$ (e.g., training and calibration settings for signal drivers or other components of the flash devices).

Although the operations of the methods herein are shown and described in a particular order, the order of the operations of each method may be altered so that certain operations may be performed in an inverse order or so that certain operation may be performed, at least in part, concurrently with other operations. In certain implementations, instructions or sub-operations of distinct operations may be in an intermittent and/or alternating manner.

It is to be understood that the above description is intended to be illustrative, and not restrictive. Many other implementations will be apparent to those of skill in the art upon reading and understanding the above description. The scope of the disclosure should, therefore, be determined with reference to the appended claims, along with the full scope of equivalents to which such claims are entitled.

In the above description, numerous details are set forth. It will be apparent, however, to one skilled in the art, that the aspects of the present disclosure may be practiced without these specific details. In some instances, well-known structures and devices are shown in block diagram form, rather than in detail, in order to avoid obscuring the present disclosure.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "receiving," "determining," "selecting," "storing," "setting," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present disclosure also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear as set forth in the description. In addition, aspects of the present disclosure are not described with reference to any particular programming language. It will be appreciated that a variety of programming languages may be used to implement the teachings of the present disclosure as described herein.

Aspects of the present disclosure may be provided as a computer program product, or software, that may include a machine-readable medium having stored thereon instructions, which may be used to program a computer system (or other electronic devices) to perform a process according to the present disclosure. A machine-readable medium includes any procedure for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.).

What is claimed is:

1. A memory module comprising:
   one or more memory devices;

a command buffer coupled to the one or more memory devices via a shared command/address line coupled between the command buffer and each of the one or more memory devices;
one or more data buffers coupled to the one or more memory devices via one or more respective data lines coupled between the one or more data buffers and each respective memory device; and
a persistent memory storing a plurality of sets of training and calibration settings corresponding to communication in the memory module, the plurality of sets of training and calibration settings comprising a first set of training and calibration settings corresponding to the shared command/address line and a second set of training and calibration settings corresponding to the one or more respective data lines, wherein the plurality of sets of training and calibration settings are stored in the persistent memory before operation of the memory module.

2. The memory module of claim 1, wherein the plurality of sets of training and calibration settings are stored in the persistent memory during manufacturing and assembly of the memory module.

3. The memory module of claim 1, wherein the command buffer is to couple the memory module to an external host system, and wherein the command buffer is to isolate the shared command/address line from the external host system.

4. The memory module of claim 1, wherein the one or more data buffers are to couple the memory module to an external host system, and wherein the one or more data buffers are to isolate the one or more respective data lines from the external host system.

5. The memory module of claim 1, wherein the one or more memory devices comprise dynamic random access memory (DRAM) devices.

6. The memory module of claim 1, wherein at least one of the command buffer or the one or more data buffers comprises control logic to:
detect a power-on event for the memory module;
receive an indication of operating conditions for the memory module;
retrieve at least one of the plurality of sets of training and calibration settings corresponding to the operating conditions from the persistent memory; and
apply the at least one of the plurality of sets of training and calibration settings to transmitter and receiver circuits of at least one of the command buffer or the one or more data buffers.

7. The memory module of claim 1, wherein the persistent memory is disposed in the command buffer.

8. The memory module of claim 1, wherein the persistent memory is disposed in the one or more data buffers.

9. A command buffer chip comprising:
a persistent memory; and
control logic coupled to the persistent memory, wherein the control logic is to retrieve a plurality of sets of training and calibration settings from the persistent memory, wherein the plurality of sets of training and calibration settings are stored in the persistent memory before operation of the command buffer chip, and to apply the plurality of sets of training and calibration settings to components of the command buffer chip during operation, the plurality of sets of training and calibration settings comprising a first set of training and calibration settings corresponding to a shared command/address line coupled between the command buffer chip and each of one or more memory devices and a second set of training and calibration settings corresponding to one or more respective data lines coupled between one or more data buffers and each respective memory device.

10. The command buffer chip of claim 9, wherein the plurality of sets of training and calibration settings are stored in the persistent memory during manufacturing and assembly of a memory module.

11. The command buffer chip of claim 10, wherein the command buffer chip is to couple the memory module to an external host system, and wherein the command buffer chip is to isolate the shared command/address line from the external host system.

12. The command buffer chip of claim 10, wherein the one or more data buffers are to couple the memory module to an external host system, and wherein the one or more data buffers are to isolate the one or more respective data lines from the external host system.

13. The command buffer chip of claim 9, wherein the one or more memory devices comprise dynamic random access memory (DRAM) devices.

14. The command buffer chip of claim 10, wherein the control logic is further to:
detect a power-on event for the memory module;
receive an indication of operating conditions for the memory module; and
determine that the plurality of sets of training and calibration settings correspond to the operating conditions from the persistent memory.

15. A method of operation of a memory module, the method comprising:
detecting a power-on event for the memory module;
receiving an indication of operating conditions for the memory module;
retrieving a plurality of sets of training and calibration settings corresponding to the operating conditions from a persistent memory in the memory module, wherein the plurality of sets of training and calibration settings are stored in the persistent memory before operation of the memory module; and
applying the at least one set of training and calibration settings to components of the memory module during operation, the plurality of sets of training and calibration settings comprising a first set of training and calibration settings corresponding to a shared command/address line coupled between a command buffer and each of one or more memory devices and a second set of training and calibration settings corresponding to one or more respective data lines coupled between one or more data buffers and each respective memory device.

16. The method of claim 15, wherein the plurality of sets of training and calibration settings are stored in the persistent memory during manufacturing and assembly of a memory module.

17. The method of claim 16, wherein the command buffer is to couple the memory module to an external host system, and wherein the command buffer is to isolate the shared command/address line from the external host system.

18. The method of claim 16, wherein the one or more data buffers are to couple the memory module to an external host system, and wherein the one or more data buffers are to isolate the one or more respective data lines from the external host system.

19. The method of claim 15, wherein the one or more memory devices comprise dynamic random access memory (DRAM) devices.

20. The method of claim 16, further comprising:
detecting a power-on event for the memory module;
receiving an indication of operating conditions for the memory module; and
determining that the plurality of sets of training and calibration settings correspond to the operating conditions from the persistent memory.

* * * * *